United States Patent
Han et al.

(10) Patent No.: US 7,031,205 B2
(45) Date of Patent: Apr. 18, 2006

(54) RANDOM ACCESS MEMORY WITH POST-AMBLE DATA STROBE SIGNAL NOISE REJECTION

(75) Inventors: Jonghee Han, Cary, NC (US);
Alexander George, Durham, NC (US);
Torsten Partsch, Raleigh, NC (US)

(73) Assignee: Infineon Technologies North America Corp., San Jose, CA (US)

( * ) Notice: Subject to any disclaimer, the term of this patent is extended or adjusted under 35 U.S.C. 154(b) by 164 days.

(21) Appl. No.: 10/674,177

(22) Filed: Sep. 29, 2003

(65) Prior Publication Data

US 2005/0068810 A1    Mar. 31, 2005

(51) Int. Cl.
*G11C 7/00* (2006.01)

(52) U.S. Cl. .................. 365/193; 365/233; 365/233.5; 365/189.05

(58) Field of Classification Search ............ 365/193 O, 365/233 X, 233.5 X, 189.05 X
See application file for complete search history.

(56) References Cited

U.S. PATENT DOCUMENTS

| | | | |
|---|---|---|---|
| 6,052,329 A | 4/2000 | Nishino et al. | |
| 6,115,322 A | 9/2000 | Kanda et al. | |
| 6,240,042 B1 | 5/2001 | Li | |
| 6,381,194 B1 | 4/2002 | Li | |
| 6,407,963 B1 | 6/2002 | Sonoda et al. | |
| 6,445,642 B1 | 9/2002 | Murakami | |
| 6,529,993 B1 | 3/2003 | Rogers et al. | |
| 6,894,945 B1 * | 5/2005 | Sawada | 365/233 |

* cited by examiner

*Primary Examiner*—Van Thu Nguyen
(74) *Attorney, Agent, or Firm*—Dicke, Billig & Czaja, PLLC

(57) ABSTRACT

A random access memory includes a first circuit configured to receive a strobe signal and provide pulses in response to transitions in the strobe signal, and a second circuit configured to receive the strobe signal to latch data into the second circuit in response to the strobe signal, and to receive the pulses to re-latch the latched data into the second circuit after the transitions in the strobe signal. The first circuit includes an enable circuit configured to provide an enable signal and a buffer circuit configured to receive the strobe signal and the enable signal and provide the pulses in response to the enable signal and the strobe signal. The enable circuit is configured to receive the pulses from the buffer circuit and stop providing the enable signal to the buffer circuit in response to receiving the pulses.

14 Claims, 6 Drawing Sheets

RANDOM ACCESS MEMORY WITH POST-AMBLE DATA STROBE SIGNAL NOISE REJECTION

BACKGROUND

One type of memory known in the art is double data rate synchronous dynamic random access memory (DDR SDRAM). In general, DDR SDRAM includes at least one array of memory cells. The memory cells in the array of memory cells are arranged in rows and columns, with the rows extending along an x-direction and the columns extending along a y-direction. Conductive word lines extend across the array of memory cells along the x-direction and conductive bit lines extend across the array of memory cells along the y-direction. A memory cell is located at each cross point of a word line and a bit line. Memory cells are accessed using a row address and a column address.

DDR SDRAM uses a main clock signal and a data strobe signal (DQS) for addressing the array of memory cells and for executing commands within the memory. The clock signal is used as a reference for the timing of commands such as read and write commands, including address and control signals. DQS is used as a reference to latch input data into the memory and output data into an external device.

During a write operation, two bits, four bits, or another even number of bits are collected and processed in the memory at the same time to maximize the bandwidth of the memory. DQS is controlled by a memory controller and the data bits are collected on each transition of DQS. At the first clock rising edge after the final DQS falling edge, the collection of data bits ends and internal processing begins.

Once collection of the data bits is complete, the memory controller may no longer drive the DQS signal resulting in noise on the DQS signal line. This noise, referred to as post-amble DQS noise, may oscillate around the termination voltage of the data bus. If the post-amble DQS noise occurs before internal processing of the collected data begins, the collected data can be corrupted as transitions in the post-amble DQS noise latch in undefined data in place of valid data.

SUMMARY

One embodiment of the present invention provides a random access memory. The random access memory comprises a first circuit configured to receive a strobe signal and provide pulses in response to transitions in the strobe signal. The random access memory comprises a second circuit configured to receive the strobe signal to latch data into the second circuit, and to receive the pulses to latch the latched data into the second circuit after the transitions in the strobe signal.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

Figure 1:
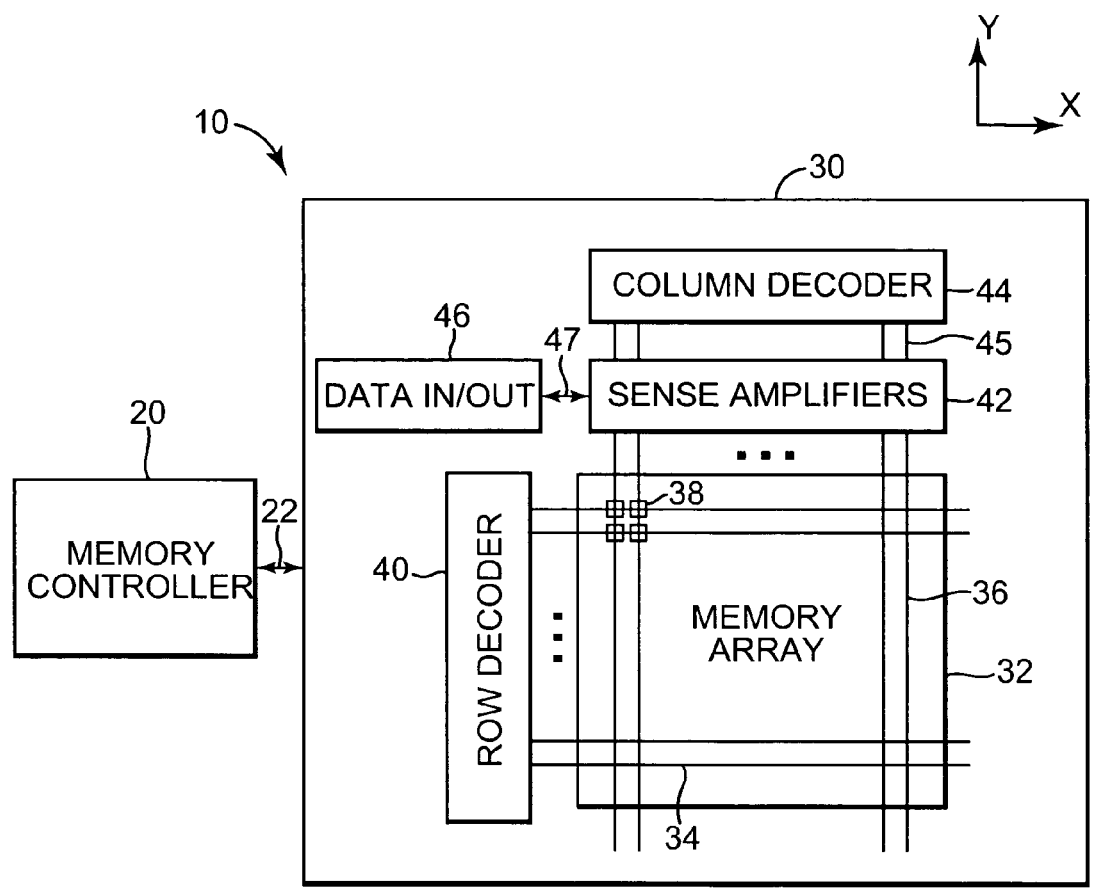
FIG. 1 is a block diagram illustrating an exemplary embodiment of a random access memory, according to the present invention.

FIG. 1 is a block diagram illustrating a random access memory 10. In one embodiment, random access memory 10 is a double data rate synchronous dynamic random access memory (DDR SDRAM). The DDR SDRAM 10 includes a memory controller 20 and at least one memory bank 30. Memory bank 30 includes an array of memory cells 32, a row decoder 40, a column decoder 44, sense amplifiers 42, and data in/out circuit 46. Memory controller 20 is electrically coupled to memory bank 30, indicated at 22.

Conductive word lines 34, referred to as row select lines, extend in the x-direction across the array of memory cells 32. Conductive bit lines 36, referred to as column select lines, extend in the y-direction across the array of memory cells 32. A memory cell 38 is located at each cross point of a word line 34 and a bit line 36. Each word line 34 is electrically coupled to row decoder 40 and each bit line 36 is electrically coupled to a sense amplifier 42. The sense amplifiers 42 are electrically coupled to column decoder 44 through conductive column decoder lines 45 and to data in/out circuit 46 through data lines 47.

Data in/out circuit 46 includes a plurality of latches and data input/output (I/O) pads or pins (DQs) to transfer data between memory bank 30 and an external device. Data written into memory bank 30 is presented as voltages on the DQs from an external device. The voltages are translated into the appropriate signals and stored in selected memory cells 38. Data read from memory bank 30 is presented by memory bank 30 on the DQs for an external device to retrieve. Data read from selected memory cells 38 appears at the DQs once access is complete and the output is enabled. At other times, the DQs are in a high impedance state.

A bidirectional data strobe (DQS) is used as a reference to latch input data into data in/out circuit 46 from the DQs during write operations and output data into an external device through the DQs during read operations. During a write operation, DQS is driven by memory controller 20 and data bits are collected on each transition of DQS. Once collection of the data bits is complete, memory controller 20 may no longer drive the DQS signal resulting in noise on the DQS signal line. To prevent the noise from latching in undefined data, a signal generating circuit is provided to generate three signals from the DQS signal and a clock signal. An internal DQS signal (DQSi) and an internal inverted DQS signal (bDQSi) are generated from the DQS signal, and a signal fDQS is generated from the DQS signal and the clock signal. A pulse is generated on signal line fDQS on the first falling edge of DQS after a rising edge of the clock signal.

Each DQ within data in/out circuit 46 includes a three stage latching circuit. Data to be written into memory bank 30 is latched into the first and second stages of the latching circuit by DQSi and bDQSi and into the third stage of the latching circuit by fDQS. The fDQS signal prevents noise on the DQS signal line from latching in undefined data in the third stage.

Memory controller 20 controls reading data from and writing data to memory bank 30. During a read operation, memory controller 20 passes the row address of a selected memory cell or cells 38 to row decoder 40. Row decoder 40 activates the selected word line 34. As the selected word line 34 is activated, the value stored in each memory cell 38 coupled to the selected word line 34 is passed to the respective bit line 36. The value of each memory cell 38 is read by a sense amplifier 42 electrically coupled to the respective bit line 36. Memory controller 20 passes a column address of the selected memory cell or cells 38 to column decoder 44. Column decoder 44 selects which sense amplifiers 42 pass data to data in/out circuit 46 for retrieval by an external device.

During a write operation, the data to be stored in array 32 is placed in data in/out circuit 46 by an external device. Memory controller 20 passes the row address for the selected memory cell or cells 38 where the data is to be stored to row decoder 40. Row decoder 40 activates the selected word line 34. Memory controller 20 passes the column address for the selected memory cell or cells 38 where the data is to be stored to column decoder 44. Column decoder 44 selects which sense amplifiers 42 are passed the data from data in/out circuit 46. Sense amplifiers 42 write the data to the selected memory cell or cells 38 through bit lines 36.

Figure 2:
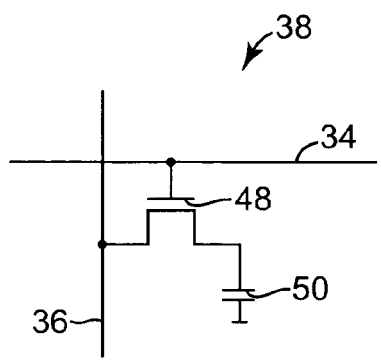
FIG. 2 is a diagram illustrating an exemplary embodiment of a memory cell.

FIG. 2 illustrates an exemplary embodiment of one memory cell 38 in the array of memory cells 32. Memory cell 38 includes a transistor 48 and a capacitor 50. The gate of transistor 48 is electrically coupled to word line 34. The drain-source path of transistor 48 is electrically coupled to bit line 36 and capacitor 50. Capacitor 50 is charged to represent either a logic 0 or a logic 1. During a read operation, word line 34 is activated to turn on transistor 48 and the value stored on capacitor 50 is read by a corresponding sense amplifier 42 through bit line 36 and transistor 48. During a write operation, word line 34 is activated to turn on transistor 48 and the value stored on capacitor 50 is written by a corresponding sense amplifier 42 through bit line 36 and transistor 48.

The read operation on memory cell 38 is a destructive read operation. After each read operation, capacitor 50 is recharged with the value that was just read. In addition, even without read operations, the charge on capacitor 50 discharges over time. To retain a stored value, memory cell 38 is refreshed periodically by reading or writing the memory cell 38. All memory cells 38 within the array of memory cells 32 are periodically refreshed to maintain their values.

In DDR SDRAM, the read and write operations are synchronized to a system clock. The system clock is supplied by a host system that includes the DDR SDRAM 10. DDR SDRAM operates from a differential clock, CK and bCK. The crossing of CK going high and bCK going low is referred to as the positive edge of CK. Commands such as read and write operations, including address and control signals, are registered at the positive edge of CK. Operations are performed on both the rising and falling edges of the system clock.

The DDR SDRAM uses a double data rate architecture to achieve high speed operation. The double data rate architecture is essentially a 2n prefetch architecture with an interface designed to transfer two data words per clock cycle at the DQs. A single read or write access for the DDR SDRAM effectively consists of a single 2n bit wide, one clock cycle data transfer at the internal memory array and two corresponding n bit wide, one half clock cycle data transfers at the DQs.

The bidirectional data strobe (DQS) is transmitted along with data for use in data capture at data in/out circuit 46. DQS is a strobe transmitted by the DDR SDRAM during read operations and by the memory controller, such as memory controller 20, during write operations. DQS is edge aligned with data for read operations and center aligned with data for write operations. Input and output data is registered on both edges of DQS.

During a write operation, DQS is controlled by memory controller 20. Once the write operation is complete, memory controller 20 no longer controls the DQS signal resulting in noise on the DQS signal. This noise, referred to as post-amble DQS noise, can oscillate around the termination voltage of the data bus. If this post-amble DQS noise occurs before internal processing of the collected data begins, the collected data can be corrupted as transitions in the post-amble DQS noise can latch in undefined data in place of valid data.

Read and write accesses to the DDR SDRAM are burst oriented. Accesses start at a selected location and continue for a programmed number of locations in a programmed sequence. Accesses begin with the registration of an active command, which is followed by a read or write command. The address bits registered coincident with the active command are used to select the bank and row to be accessed. The address bits registered coincident with the read or write command are used to select the bank and the starting column location for the burst access.

The DDR SDRAM in the preceding description is referred to as DDR-I SDRAM for being the first generation of DDR SDRAM. The next generation of DDR SDRAM, DDR-II SDRAM has the same features as DDR-I SDRAM except that the data rate is doubled. The DDR-II SDRAM architecture is essentially a 4n prefetch architecture with an interface designed to transfer four data words per clock cycle at the DQs. A single read or write access for the DDR-II SDRAM effectively consists of a single 4n bit wide, one clock cycle data transfer at the internal memory array and four corresponding n bit wide, one quarter clock cycle data transfers at the DQs. In one embodiment, DDR SDRAM 10 is a DDR-II SDRAM.

Figure 3:
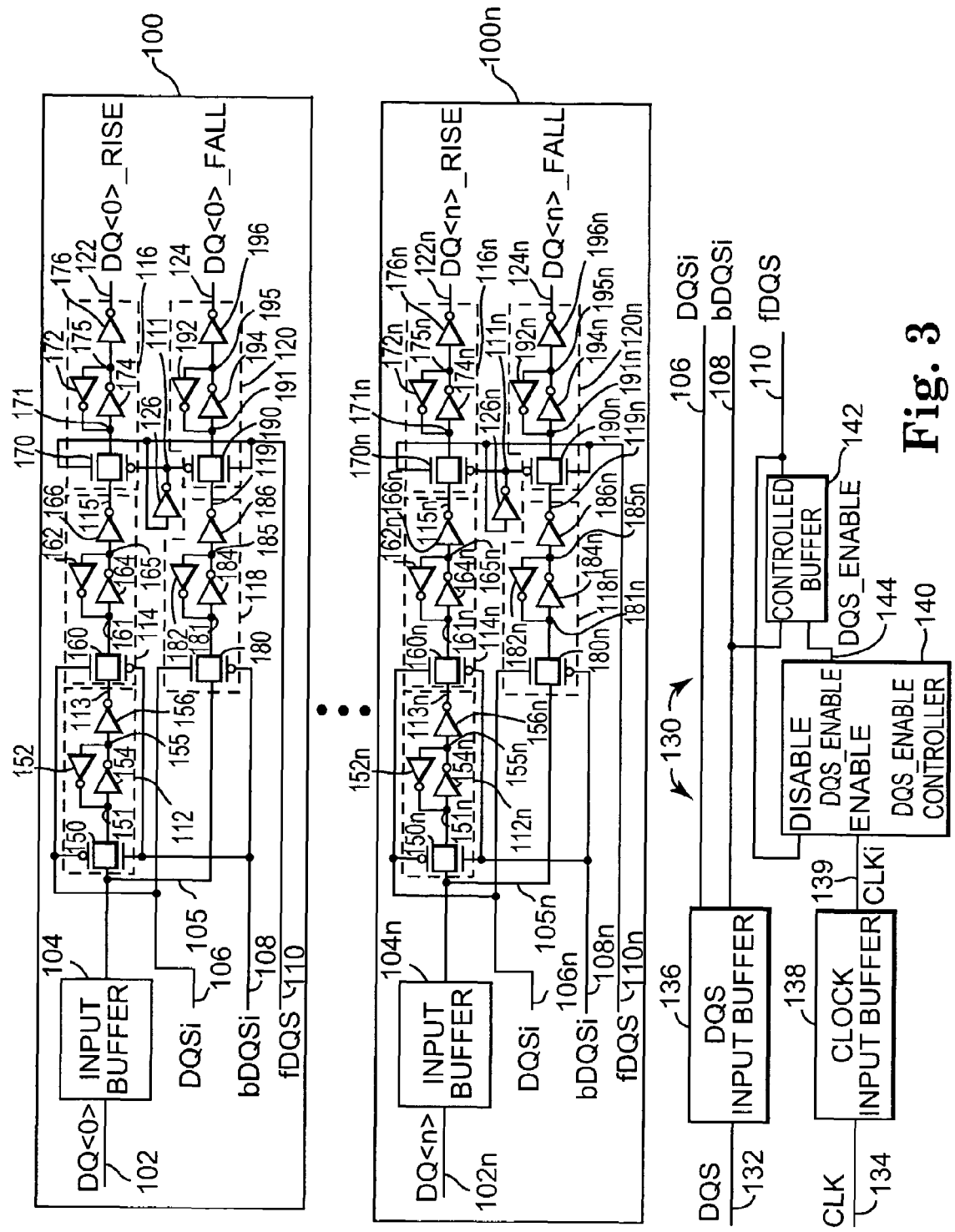
FIG. 3 is a schematic diagram illustrating an exemplary embodiment of latching circuits and a signal generating circuit for latching in data during a write operation.

FIG. 3 is a schematic diagram illustrating an exemplary embodiment of latching circuits 100–100n and signal generating circuit 130 for latching data during a write operation. The latching circuits 100–100n and signal generating circuit 130 are part of data in/out circuit 46. Data in/out circuit 46 includes n latching circuits 100–100n where n equals the number of DQs for the memory. The latching circuits 100–100n are constructed similar to one another.

Each latching circuit 100 includes a DQ signal path 102, an input buffer 104, an inverter 126, and latches 112, 114, 116, 118, and 120. In addition, each latching circuit 100 includes DQSi signal path 106, bDQSi signal path 108, fDQS signal path 110, and output signal paths DQ_rise 122 and DQ_fall 124.

DQ signal path 102 is electrically coupled to input buffer 104. Input buffer 104 is electrically coupled to latches 112 and 118 through data path 105. Latch 112 is electrically coupled to latch 114 through data path 113. Latch 114 is electrically coupled to latch 116 through data path 115. Latch 116 is electrically coupled to output signal path DQ_rise 122. Latch 118 is electrically coupled to latch 120 through data path 119 and latch 120 is electrically coupled to output signal path DQ_fall 124.

Input signal paths DQSi 106 and bDQSi 108 are electrically coupled to latches 112, 114, and 118. The fDQS signal path 110 is electrically coupled to inverter 126 and inverter 126 is electrically coupled to bfDQS signal path 111. Signal paths fDQS 110 and bfDQS 111 are electrically coupled to latches 116 and 120. Latches 112, 114, 116, 118, and 120 can be any suitable type of latch for latching a bit of data.

Latch 112 includes a transmission gate 150 and inverters 152, 154, and 156. Transmission gate 150 includes a pair of complementary metal oxide semiconductor field effect transistor (MOSFET) switches in parallel, such that an input signal to transmission gate 150 is either conducted through the transmission gate 150 or blocked. Transmission gate 150 is turned on to conduct an input signal if a logic high signal is applied to the gate of the active high MOSFET switch and if a logic low signal is applied to the gate of the active low MOSFET switch. Transmission gate 150 is turned off (non-conducting) to block an input signal if a logic low signal is applied to the gate of the active high MOSFET switch and if a logic high signal is applied to the gate of the active low MOSFET switch. The DQSi and bDQSi signals turn transmission gate 150 on or off.

Data path 105 is electrically coupled to transmission gate 150 to pass data to transmission gate 150. Transmission gate 150 is electrically coupled to inverters 152 and 154 through data path 151. The output of inverter 154 is electrically coupled to the input of inverter 152 and the output of inverter 152 is electrically coupled to the input of inverter 154. Inverters 152 and 154 are electrically coupled to inverter 156 through data path 155. The output of inverter 156 is electrically coupled to data path 113.

With transmission gate 150 conducting, data on data path 105, represented by a logic high level or a logic low level, passes to data path 151. The data on data path 151 is latched by inverters 152 and 154 as transmission gate 150 stops conducting. Inverter 156 inverts the data and provides the output to data path 113 such that the output of latch 112 is the same as the input to latch 112.

Latch 114 includes a transmission gate 160 and inverters 162, 164, and 166. Data path 113 is electrically coupled to transmission gate 160 to pass data to transmission gate 160. Transmission gate 160 operates similar to transmission gate 150. The DQSi and bDQSi signals turn transmission gate 160 on or off. Transmission gate 160 is electrically coupled to inverters 162 and 164 through data path 161. The output of inverter 164 is electrically coupled to the input of inverter 162 and the output of inverter 162 is electrically coupled to the input of inverter 164. Inverters 162 and 164 are electrically coupled to inverter 166 through data path 165. The output of inverter 166 is electrically coupled to data path 115. Latch 114 operates similar to latch 112.

Latch 116 includes a transmission gate 170 and inverters 172, 174, and 176. Data path 115 is electrically coupled to transmission gate 170 to pass data to transmission gate 170. Transmission gate 170 operates similar to transmission gate 150. The fDQS and bfDQS signals turn transmission gate 170 on or off. Transmission gate 170 is electrically coupled to inverters 172 and 174 through data path 171. The output of inverter 174 is electrically coupled to the input of inverter 172 and the output of inverter 172 is electrically coupled to the input of inverter 174. Inverters 172 and 174 are electrically coupled to inverter 176 through data path 175. The output of inverter 176 is electrically coupled to data path DQ_rise 122. Latch 116 operates similar to latch 112.

Latch 118 includes a transmission gate 180 and inverters 182, 184, and 186. Data path 105 is electrically coupled to transmission gate 180 to pass data to transmission gate 180. Transmission gate 180 operates similar to transmission gate 150. The DQSi and bDQSi signals turn transmission gate 180 on or off. Transmission gate 180 is electrically coupled to inverters 182 and 184 through data path 181. The output of inverter 184 is electrically coupled to the input of inverter 182 and the output of inverter 182 is electrically coupled to the input of inverter 184. Inverters 182 and 184 are electrically coupled to inverter 186 through data path 185. The output of inverter 186 is electrically coupled to data path 119. Latch 118 operates similar to latch 112.

Latch 120 includes a transmission gate 190 and inverters 192, 194, and 196. Data path 119 is electrically coupled to transmission gate 190 to pass data to transmission gate 190. Transmission gate 190 operates similar to transmission gate 150. The fDQS and bfDQS signals turn transmission gate 190 on or off. Transmission gate 190 is electrically coupled to inverters 192 and 194 through data path 191. The output of inverter 194 is electrically coupled to the input of inverter 192 and the output of inverter 192 is electrically coupled to the input of inverter 194. Inverters 192 and 194 are electrically coupled to inverter 196 through data path 195. The output of inverter 196 is electrically coupled to data path DQ_fall 124. Latch 120 operates similar to latch 112.

Signal generating circuit 130 includes DQS input buffer 136, clock input buffer 138, DQS enable controller 140, and controlled buffer 142. In addition signal generating circuit 130 includes DQS signal path 132, CLK signal path 134, DQSi signal path 106, bDQSi signal path 108, and fDQS signal path 110.

DQS signal path 132 is electrically coupled to DQS input buffer 136. DQS input buffer 136 is electrically coupled to DQSi signal path 106 and bDQSi signal path 108. CLK signal path 134 is electrically coupled to clock input buffer 138. Clock input buffer 138 is electrically coupled to DQS enable controller 140 through CLKi signal path 139. DQS enable controller 140 is electrically coupled to controlled buffer 142 through DQS enable signal path 144. Controlled buffer 142 is electrically coupled to fDQS signal path 110 and bDQSi signal path 108. The fDQS signal path 110 is electrically coupled to the disable input of DQS enable controller 140.

The DQSi signal is generated from DQS through DQS input buffer 136. The bDQSi signal is generated from DQS through DQS input buffer 136 and is the inverse of DQSi. The fDQS signal is generated from CLK and bDQSi. The CLKi signal is input to DQS enable controller 140 from clock input buffer 138. DQS enable controller 140 outputs a logic high signal on DQS enable output path 144 with the enable input signal CLKi logic high and the disable input signal fDQS logic low. If the disable input signal (fDQS) is logic high or the enable input signal CLKi is logic low, DQS enable controller 140 outputs a logic low signal on DQS enable output path 144. Controlled buffer 142 receives the DQS enable signal and the bDQSi signal as inputs and generates fDQS. The fDQS signal is logic high if the DQS enable signal is logic high and the bDQSi signal is logic high. The fDQS signal pulses logic high once at the first falling edge of DQS after a rising edge of CLK.

Input buffer 104 receives a data signal through DQ signal path 102. The data signal on DQ signal path 102 (clock rising edge data signal) is passed to latch 112 on the falling edge of DQSi as DQSi transitions to logic low and bDQSi transitions to logic high to turn on transmission gate 150 (conducting). The data signal on signal path 105 is latched into latch 112 as DQSi transitions to logic high and bDQSi transitions to logic low to turn off (non-conducting) transmission gate 150.

As DQSi transitions to logic high and bDQSi transitions to logic low to turn on (conducting) transmission gate 160 of latch 114, the data signal in latch 112 is passed to latch 114 on data path 113. In addition, the data signal on signal path 105 (clock falling edge data signal) is passed to latch 118 as DQSi transitions to logic high and bDQSi transitions to logic low to turn on transmission gate 180. The data in latch 114 and the data in latch 118 are latched on the falling edge of DQSi as DQSi transitions to logic low and bDQSi transitions to logic high to turn off transmission gates 160 and 180.

A rising edge of fDQS passes the data in latch 114 to latch 116 through data path 115 as fDQS transitions to logic high and bfDQS transitions to logic low to turn on transmission gate 170. The rising edge of fDQS passes the data from latch 118 to latch 120 through data path 119 as fDQS transitions to logic high and bfDQS transitions to logic low to turn on transmission gate 190.

The falling edge of fDQS latches the data into latch 116 as fDQS transitions to logic low and bfDQS transitions to logic high to turn off transmission gate 170. Latch 116 passes the data to DQ_rise signal path 122. In addition, the falling edge of fDQS latches the data into latch 120 as fDQS transitions to logic low and bfDQS transitions to logic high to turn off transmission gate 190. Latch 120 passes the data to DQ_fall signal path 124. DQ_rise signal path 122 and DQ_fall signal path 124 pass the data to sense amplifiers 42 for storage in the array of memory cells 32.

During a write operation, an external device provides data on the rising and falling edges of CLK to DQ signal paths 102–102n. DQSi and bDQSi latch the rising edge data into latches 112 and 114 and the falling edge data into latch 118. The fDQS signal latches the rising and falling edge data into latches 116 and 120 for output to DQ_rise signal path 122 and DQ_fall signal path 124 respectively. The data on DQ_rise signal path 122 and DQ_fall signal path 124 is written to selected memory cells 38 of the array of memory cells 32.

Figure 4:
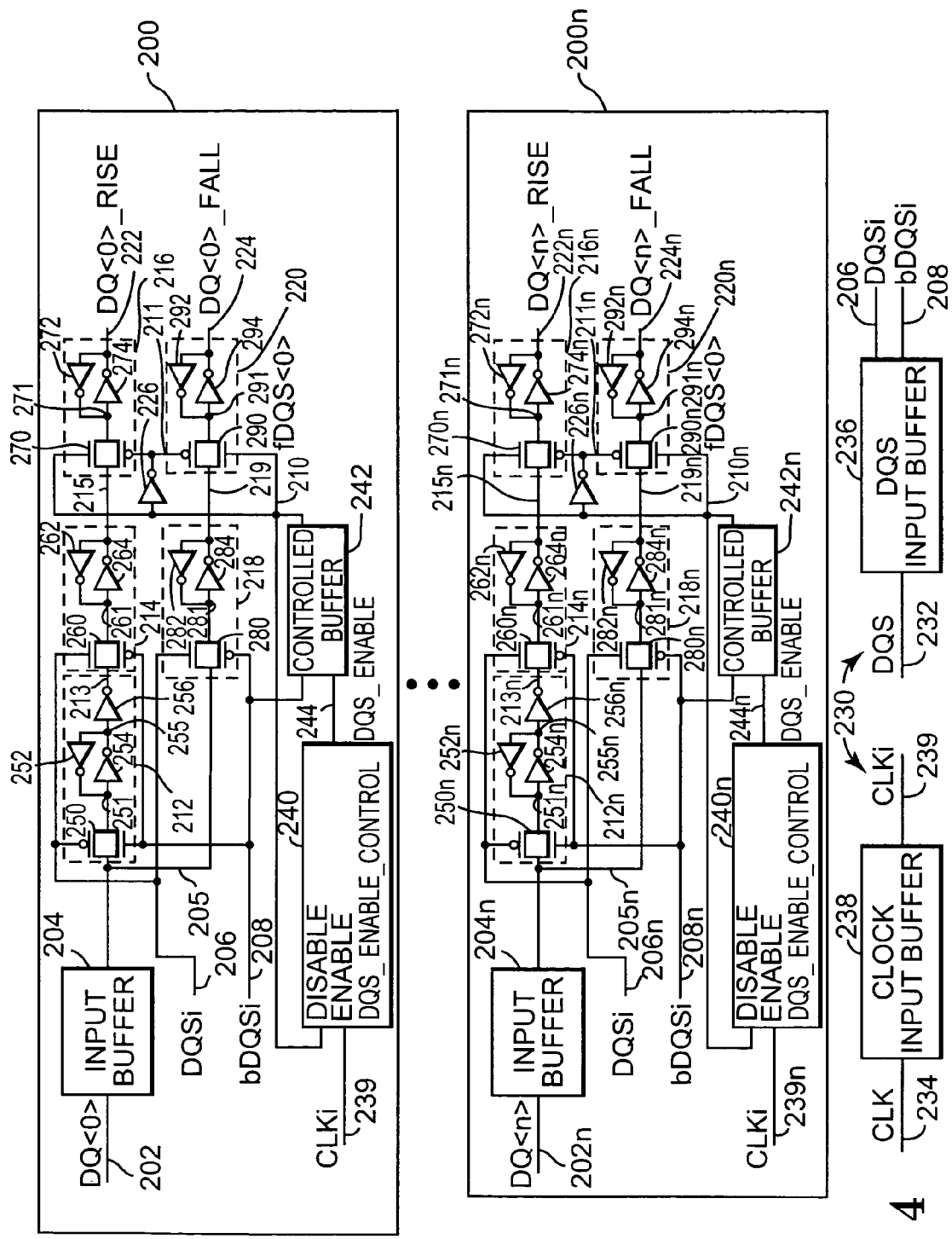
FIG. 4 is a schematic diagram illustrating another exemplary embodiment of latching circuits and signal generating circuits for latching in data during a write operation.

FIG. 4 is a schematic diagram illustrating another embodiment of latching circuits, indicated at 200–200n. The latching circuits 200–200n include DQS enable controllers 240–240n and controlled buffers 242–242n for each latching circuit 200–200n. The latching circuits 200–200n and signal generating circuit 230 are part of data in/out circuit 46. Data in/out circuit 46 includes n latching circuits 200–200n where n equals the number of DQs for the memory. The latching circuits 200–200n are constructed similar to one another.

Each latching circuit 200 includes a DQ signal path 202, an input buffer 204, an inverter 226, and latches 212, 214, 216, 218, and 220. In addition, each latching circuit 200 includes DQSi signal path 206, bDQSi signal path 208, fDQS signal path 210, and output signal paths DQ_rise 222 and DQ_fall 224.

DQ signal path 202 is electrically coupled to input buffer 204. Input buffer 204 is electrically coupled to latches 212 and 218 through data path 205. Latch 212 is electrically coupled to latch 214 through data path 213. Latch 214 is electrically coupled to latch 216 through data path 215. Latch 216 is electrically coupled to output signal path DQ_rise 222. Latch 218 is electrically coupled to latch 220 through data path 219 and latch 220 is electrically coupled to output signal path DQ_fall 224.

Input signal paths DQSi 206 and bDQSi 208 are electrically coupled to latches 212, 214, and 218. The fDQS signal path 210 is electrically coupled to inverter 226 and inverter 226 is electrically coupled to bfDQS signal path 211. Signal paths fDQS 210 and bfDQS 211 are electrically coupled to latches 216 and 220. Latches 212, 214, 216, 218, and 220 can be any suitable type of latch for latching a bit of data.

Latch 212 includes a transmission gate 250 and inverters 252, 254, and 256. Transmission gate 250 includes a pair of complementary metal oxide semiconductor field effect transistor (MOSFET) switches in parallel, such that an input signal to transmission gate 250 is either conducted through the transmission gate 250 or blocked. Transmission gate 250 is turned on to conduct an input signal if a logic high signal is applied to the gate of the active high MOSFET switch and if a logic low signal is applied to the gate of the active low MOSFET switch. Transmission gate 250 is turned off (non-conducting) to block an input signal if a logic low signal is applied to the gate of the active high MOSFET switch and if a logic high signal is applied to the gate of the active low MOSFET switch. The DQSi and bDQSi signals turn transmission gate 250 on or off.

Data path 205 is electrically coupled to transmission gate 250 to pass data to transmission gate 250. Transmission gate 250 is electrically coupled to inverters 252 and 254 through data path 251. The output of inverter 254 is electrically coupled to the input of inverter 252 and the output of inverter 252 is electrically coupled to the input of inverter 254. Inverters 252 and 254 are electrically coupled to inverter 256 through data path 255. The output of inverter 256 is electrically coupled to data path 213.

With transmission gate 250 conducting, data on data path 205, represented by a logic high level or a logic low level, passes to data path 251. The data on data path 251 is latched by inverters 252 and 254 as transmission gate 250 stops conducting. Inverter 256 inverts the data and provides the output to data path 213 such that the output of latch 212 is the same as the input to latch 212.

Latch 214 includes a transmission gate 260 and inverters 262 and 264. Data path 213 is electrically coupled to transmission gate 260 to pass data to transmission gate 260. Transmission gate 260 operates similar to transmission gate 250. The DQSi and bDQSi signals turn transmission gate 260 on or off. Transmission gate 260 is electrically coupled to inverters 262 and 264 through data path 261. The output of inverter 264 is electrically coupled to the input of inverter 262 and the output of inverter 262 is electrically coupled to the input of inverter 264. Inverters 262 and 264 are electrically coupled to data path 215.

With transmission gate 260 conducting, data on data path 213, represented by a logic high level or a logic low level, passes to data path 261. The data on data path 261 is latched by inverters 262 and 264 as transmission gate 260 stops conducting. Inverter 264 inverts the data and provides the output to data path 215 such that the output of latch 214 is the inverse of the input to latch 214.

Latch 216 includes a transmission gate 270 and inverters 272 and 274. Data path 215 is electrically coupled to transmission gate 270 to pass data to transmission gate 270. Transmission gate 270 operates similar to transmission gate 250. The fDQS and bfDQS signals turn transmission gate 270 on or off. Transmission gate 270 is electrically coupled to inverters 272 and 274 through data path 271. The output of inverter 274 is electrically coupled to the input of inverter 272 and the output of inverter 272 is electrically coupled to the input of inverter 274. Inverters 272 and 274 are electrically coupled to data path DQ_rise 222. Latch 216 operates similar to latch 214.

Latch 218 includes a transmission gate 280 and inverters 282 and 284. Data path 205 is electrically coupled to transmission gate 280 to pass data to transmission gate 280. Transmission gate 280 operates similar to transmission gate 250. The DQSi and bDQSi signals turn transmission gate 280 on or off. Transmission gate 280 is electrically coupled to inverters 282 and 284 through data path 281. The output of inverter 284 is electrically coupled to the input of inverter 282 and the output of inverter 282 is electrically coupled to the input of inverter 284. Inverters 282 and 284 are electrically coupled to data path 219. Latch 218 operates similar to latch 214.

Latch 220 includes a transmission gate 290 and inverters 292 and 294. Data path 219 is electrically coupled to transmission gate 290 to pass data to transmission gate 290. Transmission gate 290 operates similar to transmission gate 250. The fDQS and bfDQS signals turn transmission gate 290 on or off. Transmission gate 290 is electrically coupled to inverters 292 and 294 through data path 291. The output of inverter 294 is electrically coupled to the input of inverter 292 and the output of inverter 292 is electrically coupled to the input of inverter 294. Inverters 292 and 294 are electrically coupled to data path DQ_fall 224. Latch 220 operates similar to latch 214.

CLKi signal path 239 is electrically coupled to DQS enable controller 240. DQS enable controller 240 is electrically coupled to controlled buffer 242 through DQS enable signal path 244. Controlled buffer 242 is electrically coupled to fDQS signal path 210 and bDQSi signal path 208. The fDQS signal path 210 is electrically coupled to the disable input of DQS enable controller 240.

Signal generating circuit 230 includes DQS input buffer 236 and clock input buffer 238. In addition, signal generating circuit 230 includes CLK signal path 234, CLKi signal path 239, DQS signal path 232, DQSi signal path 206, and bDQSi signal path 208.

DQS signal path 232 is electrically coupled to DQS input buffer 236. DQS input buffer 236 is electrically coupled to DQSi signal path 206 and bDQSi signal path 208. CLK signal path 234 is electrically coupled to clock input buffer 238. Clock input buffer 238 is electrically coupled to CLKi signal path 239.

The DQSi signal is generated from DQS through DQS input buffer 236. The bDQSi signal is generated from DQS through DQS input buffer 236 and is the inverse of DQSi. The fDQS signal is generated from CLK and bDQSi. The CLKi signal is input to DQS enable controller 240 from clock input buffer 238. DQS enable controller 240 outputs a logic high signal on DQS enable output path 244 with the enable input signal CLKi logic high and the disable input signal fDQS logic low. If the disable input signal (fDQS) is logic high or enable input signal CLKi is logic low, DQS enable controller 240 outputs a logic low signal on DQS enable output path 244. Controlled buffer 242 receives the DQS enable signal and bDQSi signal as inputs and generates fDQS. The fDQS signal is logic high if the DQS enable signal is logic high and the bDQSi signal is logic high. The fDQS signal pulses logic high once at the first falling edge of DQS after a rising edge of CLK.

Input buffer 204 receives a data signal through DQ signal path 202. The data signal on DQ signal path 202 (clock rising edge data signal) is passed to latch 212 on the falling edge of DQSi as DQSi transitions to logic low and bDQSi transitions to logic high to turn on transmission gate 250 (conducting). The data signal on signal path 205 is latched into latch 212 as DQSi transitions to logic high and bDQSi transitions to logic low to turn off (non-conducting) transmission gate 250.

As DQSi transitions to logic high and bDQSi transitions to logic low to turn on (conducting) transmission gate 260 of latch 214, the data signal in latch 212 is passed to latch 214 on data path 213. In addition, the data signal on signal path 205 (clock falling edge data signal) is passed to latch 218 as DQSi transitions to logic high and bDQSi transitions to logic low to turn on transmission gate 280. The data in latch 214 and the data in latch 218 are latched on the falling edge of DQSi as DQSi transitions to logic low and bDQSi transitions to logic high to turn off transmission gates 260 and 280.

The rising edge of fDQS passes the data in latch 214 to latch 216 through data path 215 as fDQS transitions to logic high and bfDQS transitions to logic low to turn on transmission gate 270. The rising edge of fDQS passes the data from latch 218 to latch 220 through data path 219 as fDQS transitions to logic high and bfDQS transitions to logic low to turn on transmission gate 290.

The falling edge of fDQS latches the data into latch 216 as fDQS transitions to logic low and bfDQS transitions to logic high to turn off transmission gate 270. Latch 216 passes the data to DQ_rise signal path 222. In addition, the falling edge of fDQS latches the data into latch 220 as fDQS transitions to logic low and bfDQS transitions to logic high to turn off transmission gate 290. Latch 220 passes the data to DQ_fall signal path 224. DQ_rise signal path 222 and DQ_fall signal path 224 pass the data to sense amplifiers 42 for storage in the array of memory cells 32.

During a write operation, an external device provides data on the rising and falling edges of CLK to DQ signal paths 202–202n. DQSi and bDQSi latch the rising edge data into latches 212 and 214 and the falling edge data into latch 218. The fDQS signal latches the rising and falling edge data into latches 216 and 220 for output to DQ_rise signal path 222 and DQ_fall signal path 224 respectively. The data on DQ_rise signal path 222 and DQ_fall signal path 224 is written to selected memory cells 38 of the array of memory cells 32.

Figure 5:
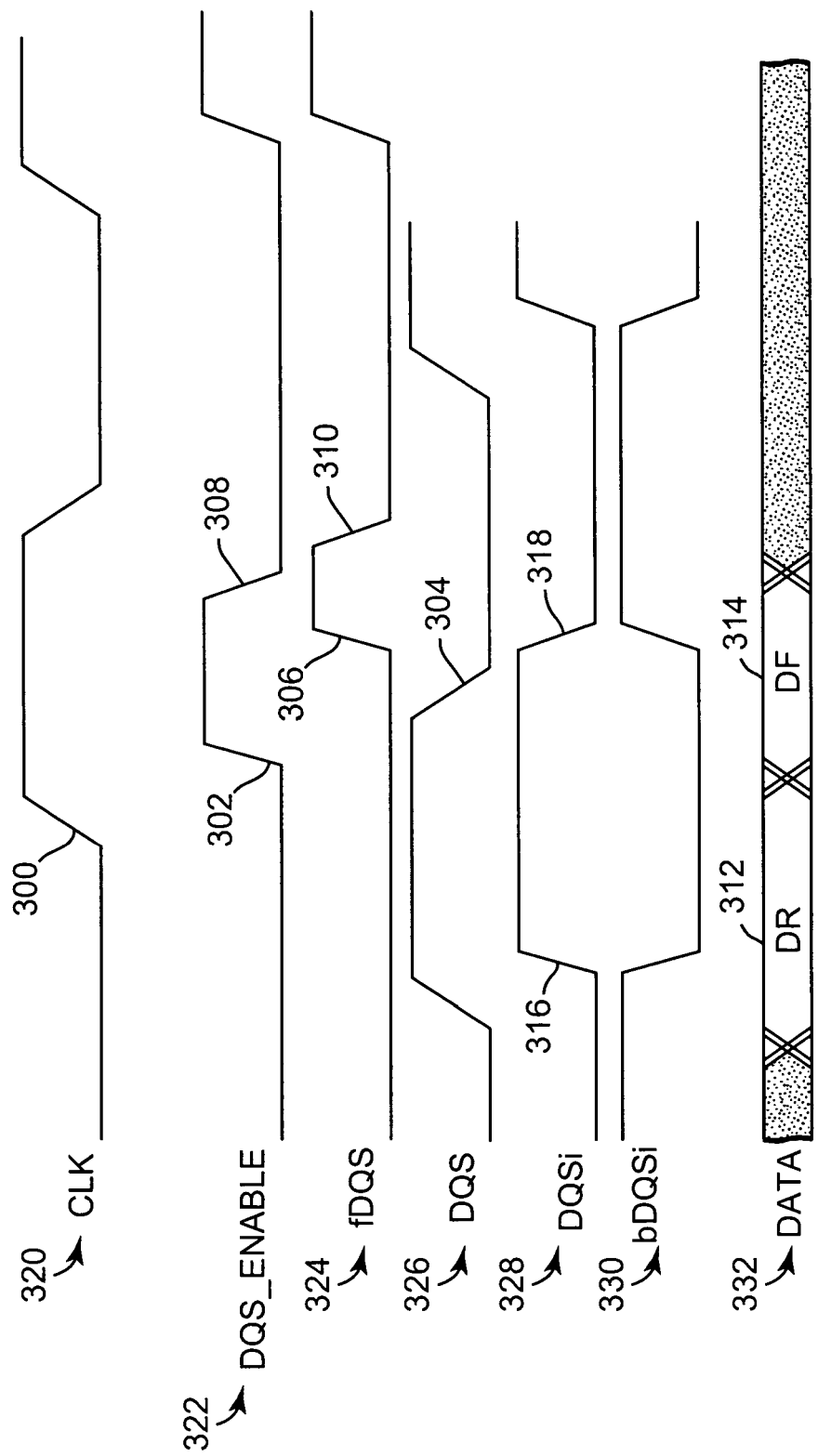
FIG. 5 is a timing diagram illustrating signal timing for the latching circuits.

FIG. 5 is a timing diagram illustrating signal timing for latching circuits 100–100n and 200–200n. The timing diagram includes signals CLK at 320 on signal paths 134 and 234, DQS_enable at 322 on signal paths 144 and 244, fDQS at 324 on signal paths 110 and 210, DQS at 326 on signal paths 132 and 232, DQSi at 328 on signal paths 106 and 206, bDQSi at 330 on signal paths 108 and 208, and DATA at 332 on DQ signal paths 102 and 202.

The rising edge at 300 of CLK 320 enables DQS enable controller 140 and 240 causing the output DQS_enable 322 to transition to logic high at 302. With DQS_enable 322 at logic high, the falling edge at 304 of DQS 326 generates a rising edge at 306 on fDQS 324 through controlled buffer 142 and 242. The rising edge at 306 of fDQS 324 disables DQS enable controller 140 and 240 causing DQS_enable 322 to transition to logic low at 308. As DQS_enable 322 transitions to logic low at 308, fDQS 324 transitions to logic low at 310.

Latches 112 and 212 latch in data 312 on the rising edge at 316 of DQSi 328. Latches 114 and 214 latch in data 312 passed from latches 112 and 212 respectively on the falling edge at 318 of DQSi 328. In addition, latches 118 and 218 latch in data 314 on the falling edge at 318 of DQSi 328. Latches 116 and 216 are passed data 312 from latches 114 and 214 respectively on the rising edge at 306 of fDQS 324. In addition, latches 120 and 220 are passed data 314 from latches 118 and 218 respectively on the rising edge at 306 of fDQS 324. On the falling edge at 310 of fDQS 324, latches 116 and 216 latch in data 312 and latches 120 and 220 latch in data 314. The process is repeated for each cycle of CLK 320.

Figures 6, 7:
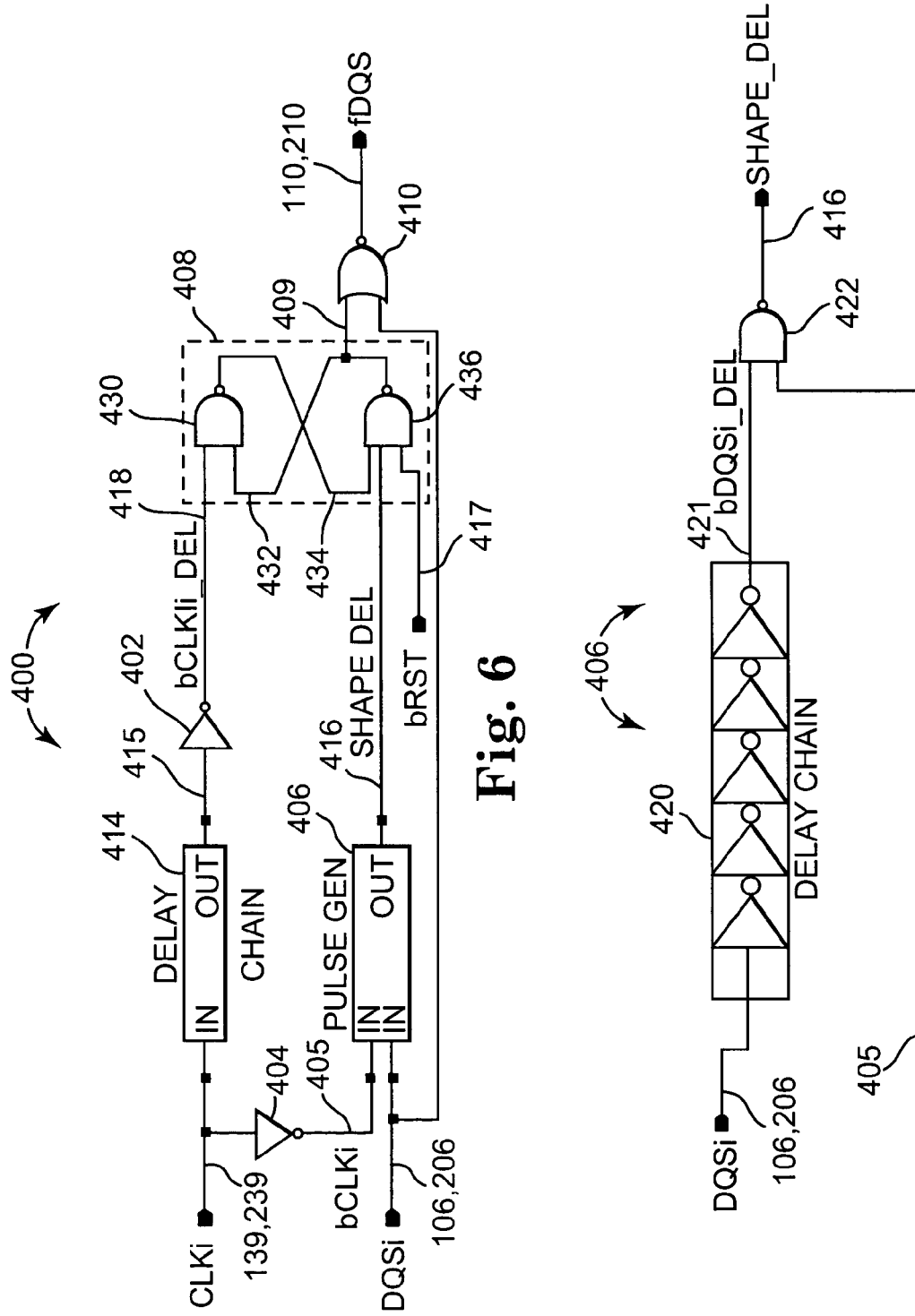
FIG. 6 is a schematic diagram illustrating an exemplary embodiment of a DQS edge control circuit.
FIG. 7 is a schematic diagram illustrating an exemplary embodiment of a pulse generator.

FIG. 6 is a schematic diagram illustrating an exemplary embodiment of a DQS edge control circuit, indicated at 400. The DQS edge control circuit 400 replaces DQS enable controller 140 and 240 and controlled buffer 142 and 242. DQS edge control circuit 400 includes a delay chain 414, inverters 402 and 404, a pulse generator or logic circuit 406, a latch 408, and a NOR gate 410. DQS edge control circuit 400 is electrically coupled to CLKi signal paths 139 and 239, DQSi signal paths 106 and 206, and fDQS signal paths 110 and 210.

CLKi is provided to delay chain 414 and inverter 404. Delay chain 414 is electrically coupled to the input of inverter 402 through signal path 415 and the output of inverter 402 is electrically coupled to an input of latch 408 through bCLKi_DEL signal path 418. Inverter 404 is electrically coupled to an input of pulse generator 406 through signal path 405 and inverts the CLKi signal to inverted signal bCLKi. DQSi is provided to an input of pulse generator 406 and to an input of NOR gate 410. The output of pulse generator 406 is electrically coupled to an input of latch 408 through SHAPE_DEL signal path 416.

The output of latch 408 is electrically coupled to an input of NOR gate 410 through signal path 409. The output of NOR gate 410 provides the fDQS signal on fDQS signal path 110 and 210. Reset signal 417 is input to latch 408 for resetting latch 408 and holding fDQS low.

Latch 408 is a NAND gate latch. Latch 408 includes NAND gates 430 and 436. The output of NAND gate 430 is electrically coupled to an input of NAND gate 436 through signal path 434. The output of NAND gate 436 is electrically coupled to an input of NAND gate 430 through signal path 432 and to signal path 409. Signal path 418 is electrically coupled to an input of NAND gate 430. Signal path 416 and bRST signal path 417 are electrically coupled to NAND gate 436.

Delay chain 414 delays the CLKi signal and inverter 402 inverts the delayed CLKi signal to provide bCLKi_DEL as an input to latch 408. Pulse generator 406 generates a logic low pulse SHAPE_DEL from the bCLKi and DQSi signals at the falling edge of CLKi. With bCLKi_DEL logic low, bRST logic high, and SHAPE_DEL logic high, the output of latch 408 is logic low. As SHAPE_DEL transitions to logic low and bCLKi_DEL remains logic low, the output of latch 408 transitions to logic high. As bCLKi_DEL transitions to logic high, the output of latch 408 remains logic high.

With the output of latch 408 logic high and DQSi logic high, the output of NOR gate 410 is logic low. As bCLKi_DEL transitions to logic low with SHAPE_DEL and bRST logic high, the output of latch 408 transitions to logic low. The output of NOR gate 410 remains logic low. As DQSi transitions to logic low and the output of latch 408 remains logic low, the output of NOR gate 410, which provides fDQS, transitions to logic high. As SHAPE_DEL transitions to logic low, the output of latch 408 transitions to logic high and the output of NOR gate 410 transitions to logic low. The fDQS signal pulses logic high once at the first falling edge of DQS after a rising edge of CLK and CLKi.

FIG. 7 is a schematic diagram illustrating pulse generator 406 in more detail. Pulse generator 406 includes delay chain 420 and NAND gate 422. DQSi is input to delay chain 420. Delay chain 420 is electrically coupled to NAND gate 422 through bDQSi_DEL signal path 421. The bCLKi signal is input to NAND gate 422 and NAND gate 422 outputs SHAPE_DEL on signal path 416.

Delay chain 420 includes an odd number of inverters. With DQSi logic low and bCLKi logic low, output SHAPE_DEL is logic high. With DQSi logic low and bCLKi logic high, output SHAPE_DEL is logic low. With DQSi logic high and bCLKi logic high, output SHAPE_DEL is logic high. With DQSi logic high and bCLKi logic low, output SHAPE_DEL is logic high.

Figure 8:
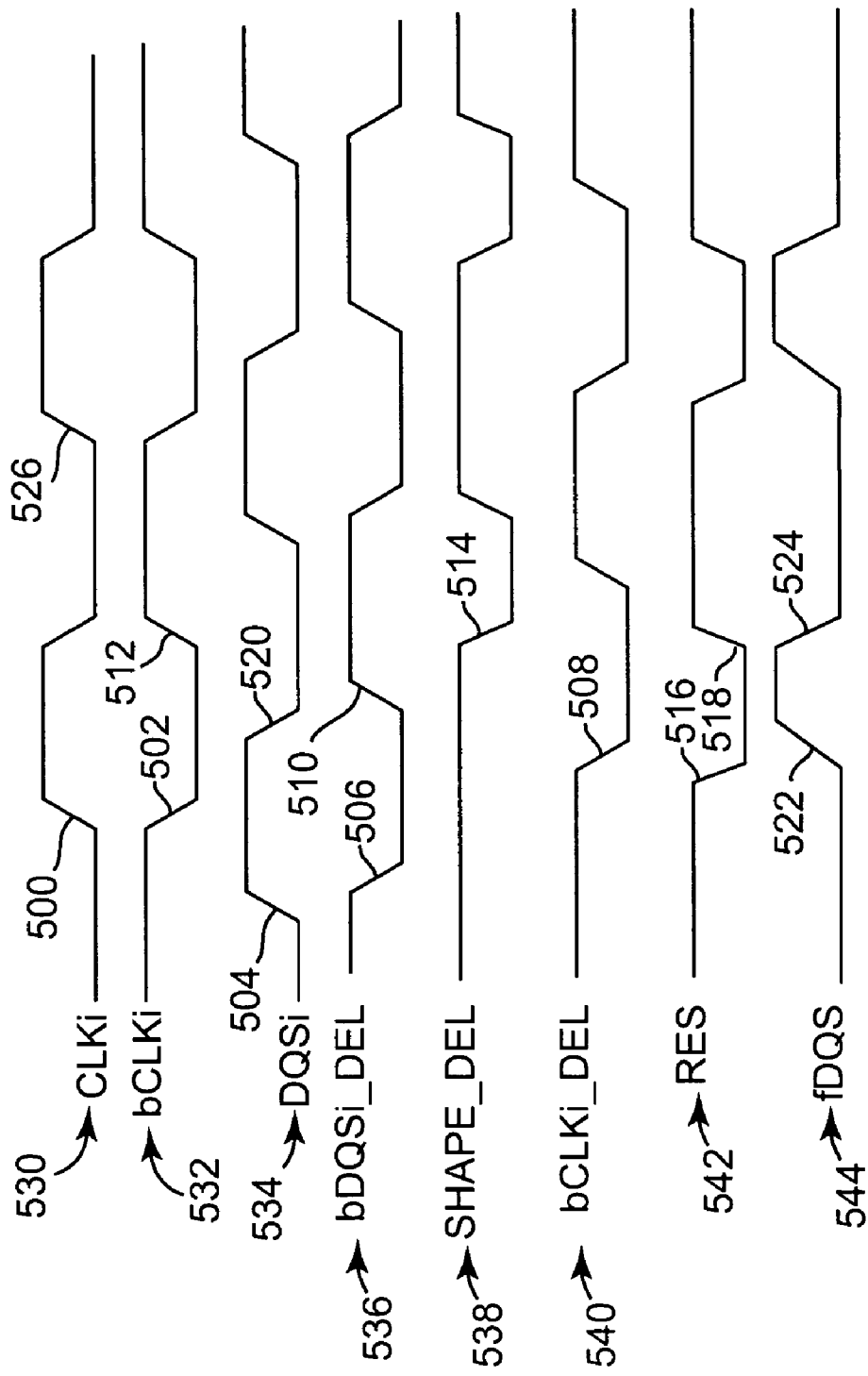
FIG. 8 is a timing diagram illustrating signal timing for the DQS edge control circuit.

FIG. 8 is a timing diagram illustrating signal timing for DQS edge control circuit 400. The timing diagram includes signals CLKi at 530 on signal path 139 and 239, bCLKi at 532 on signal path 405, DQSi at 534 on signal paths 106 and 206, bDQSi_DEL at 536 on signal path 421, SHAPE_DEL at 538 on signal path 416, bCLKi_DEL at 540 on signal path 418, RES at 542 on signal path 409, and fDQS at 544 on signal paths 110 and 210.

CLKi 530 transitions to logic high at 500 causing bCLKi 532 to transition to logic low at 502 and bCLKi_DEL 540 to transition to logic low at 508. DQSi 534 transitions to logic high at 504 causing bDQSi_DEL 536 to transition to logic low at 506. The transition of bCLKi_DEL 540 to logic low at 508 causes RES 542 to transition to logic low at 516. With RES 542 logic low, the transition of DQSi 534 to logic low at 520 causes fDQS 544 to transition to logic high at 522. The bDQSi_DEL signal 536 transitions to logic high at 510 and bCLKi 532 transitions to logic high at 512 causing SHAPE_DEL 538 to transition to logic low at 514. The transition of SHAPE_DEL 538 to logic low at 514 causes RES 542 to transition to logic high at 518 causing fDQS 544 to transition to logic low at 524. The process repeats on the rising edge at 526 of CLKi 530.

The embodiments described prevent post-amble DQS noise from corrupting input data during write operations. The fDQS signal generated from the DQS signal and the clock signal provides a single pulse to latch write data into latches 116 and 120 and into latches 216 and 220 before the data is passed to memory array 32. Valid data is not lost due to post-amble DQS noise latching in undefined data in place of valid data.

What is claimed is:

1. A random access memory, comprising:
    a first circuit configured to receive a strobe signal and provide pulses in response to transitions in the strobe signal; and
    a second circuit configured to receive the strobe signal to latch data into the second circuit in response to the strobe signal, and to receive the pulses to re-latch the latched data into the second circuit after the transitions in the strobe signal,
    wherein the first circuit comprises:
        an enable circuit configured to provide an enable signal; and
        a buffer circuit configured to receive the strobe signal and the enable signal and provide the pulses in response to the enable signal and the strobe signal,
        wherein the enable circuit is configured to receive the pulses from the buffer circuit and stop providing the enable signal to the buffer circuit in response to receiving the pulses.

2. The random access memory of claim 1, wherein the first circuit provides one of the pulses during each cycle of the strobe signal and each cycle of a clock signal.

3. The random access memory of claim 1, wherein second circuit comprises:
    a first latch configured to latch first data at first transitions in the strobe signal; and second latches configured to latch the latched first data from the first latch and second data at second transitions in the strobe signal.

4. The random access memory of claim 3, wherein the second circuit comprises:
third latches configured to latch in the latched first and second data from the second latches with the pulses after the second transitions.

5. The random access memory of claim 1, wherein the memory comprises a double data rate-I synchronous dynamic random access memory.

6. The random access memory of claim 1, wherein the memory comprises a double data rate-II synchronous dynamic random access memory.

7. A random access memory, comprising:
means for generating a pulse after a transition in a data strobe signal;
means for latching data using the data strobe signal; and
means for latching the latched data using the pulse,
wherein the means for latching the latched data comprises a third latch stage configured to receive the pulse and latch the latched data into the third latch stage.

8. The random access memory of claim 7, wherein the means for generating a pulse comprises a means for generating the pulse after a falling edge of the data strobe signal and before a rising edge of the data strobe signal.

9. The random access memory of claim 7, wherein the means for latching data comprises:
means for latching data at a rising edge of the data strobe signal;
means for latching data at a falling edge of the data strobe signal; and
means for latching latched data with the data strobe signal.

10. A method for rejecting post-amble noise on a data strobe signal in a random access memory, comprising:
generating a pulse before the data strobe signal floats; and
latching data into a latch stage with the pulse to preserve the data,
wherein generating the pulse comprises:
receiving a signal at an enable circuit;
generating an enable signal from a transition on the received signal;
receiving the enable signal and the data strobe signal at a buffer circuit;
generating a start of the pulse based on the received enable signal and the received data strobe signal; and
receiving the start of the pulse at the enable circuit.

11. The method of claim 10, wherein generating the pulse comprises generating the pulse during each cycle of the data strobe signal and each cycle of a clock signal.

12. The method of claim 10, wherein generating the pulse comprises generating the pulse after a falling edge of the data strobe signal.

13. The method of claim 10, wherein generating the pulse comprises:
generating an enable signal; and
generating a start of the pulse based on the enable signal and the data strobe signal.

14. A random access memory, comprising:
a first circuit configured to receive a strobe signal and provide pulses in response to transitions in the strobe signal; and
a second circuit configured to receive the strobe signal to latch data into the second circuit in response to the strobe signal, and to receive the pulses to re-latch the latched data into the second circuit after the transitions in the strobe signal,
wherein the second circuit comprises:
a first latch configured to latch first data at first transitions in the strobe signal;
second latches configured to latch the latched first data from the first latch and second data at second transitions in the strobe signal; and
third latches configured to latch in the latched first and second data from the second latches with the pulses after the second transitions.

* * * * *